United States Patent [19]
Haji-Sheikh

[11] Patent Number: 5,667,879
[45] Date of Patent: Sep. 16, 1997

[54] TAN/NIFE/TAN ANISOTROPIC MAGNETIC SENSOR ELEMENT

[75] Inventor: Michael J. Haji-Sheikh, Richardson, Tex.

[73] Assignee: Honeywell Inc., Minneapolis, Minn.

[21] Appl. No.: 527,471

[22] Filed: Sep. 13, 1995

[51] Int. Cl.[6] ........................................ B32B 9/00
[52] U.S. Cl. .................... 428/209; 428/901; 360/113; 324/252
[58] Field of Search .................... 324/252; 360/113; 428/209, 210, 688, 901; 437/180, 60, 226; 365/171

[56] References Cited

U.S. PATENT DOCUMENTS

| | | |
|---|---|---|
| 5,005,064 | 4/1991 | Yoshino et al. |
| 5,140,549 | 8/1992 | Fryer ........................ 365/171 |
| 5,308,792 | 5/1994 | Okabayashi ............... 437/180 |
| 5,489,548 | 2/1996 | Nishioka ................... 437/60 |
| 5,514,822 | 5/1996 | Scott ......................... 427/226 |

FOREIGN PATENT DOCUMENTS

| | | | |
|---|---|---|---|
| 529959 | 3/1993 | European Pat. Off. | 360/113 |
| 9411889 | 5/1994 | WIPO | 360/113 |

OTHER PUBLICATIONS

Tipler, Physics 2nd Ed. p. 802.

Primary Examiner—Patrick Ryan
Assistant Examiner—Patrick Jewik
Attorney, Agent, or Firm—William D. Lanyi

[57] ABSTRACT

A stack of two refractory nitride layers and a magnetoresistive layer are used to facilitate electrical connection between components of a sensor. The stack of tantalum nitride and nickel iron layers are disposed over a silicide layer that is, in turn, disposed on a diffusion of conductive material within the body of a silicon layer. A titanium tungsten layer is disposed on the stack and below a subsequent layer of a conductive metal such as aluminum. A silicon nitride passivation layer is disposed over all of the other layers.

14 Claims, 4 Drawing Sheets

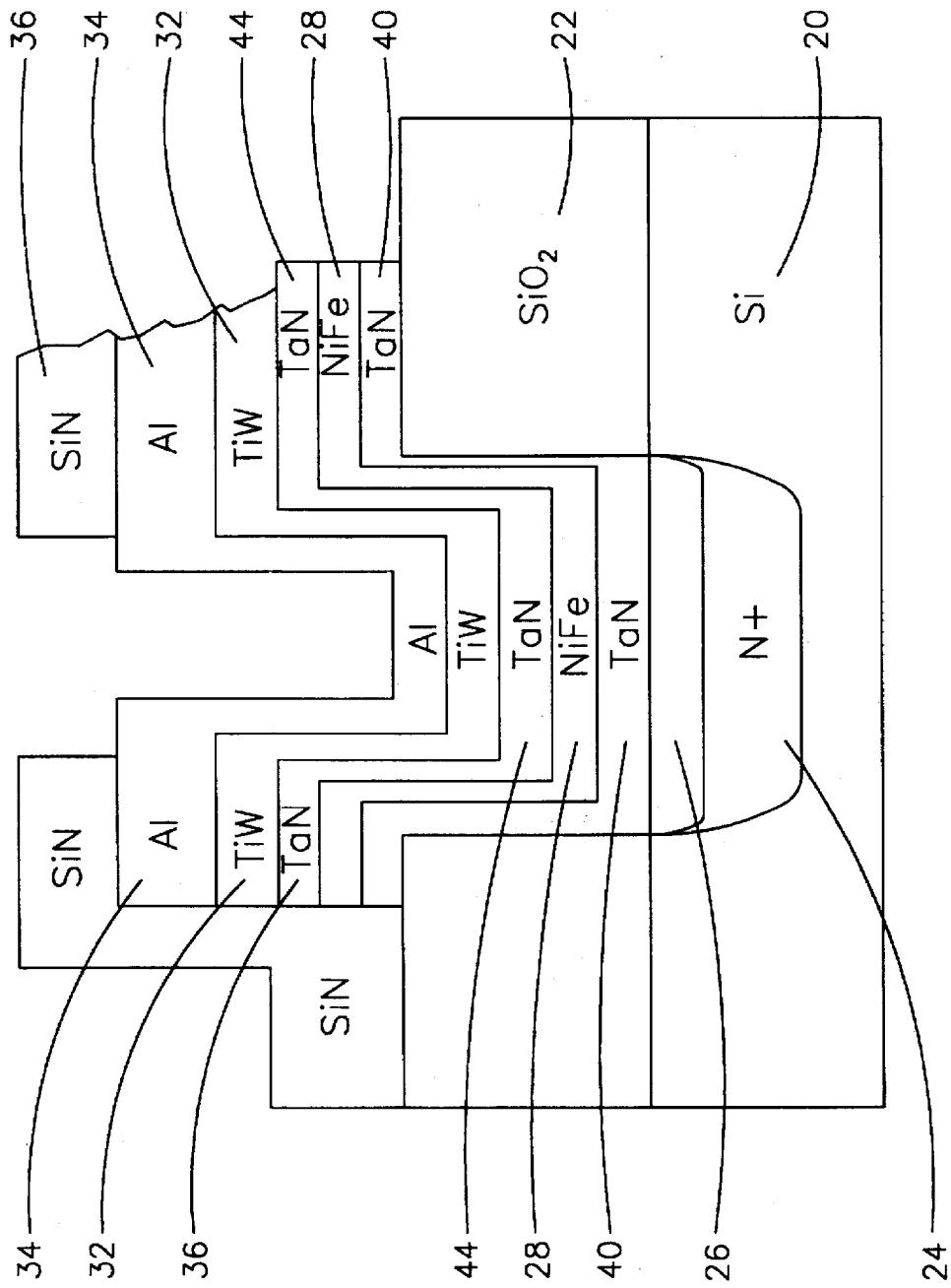

TAN/NIFE/TAN ANISOTROPIC MAGNETIC SENSOR ELEMENT

BACKGROUND OF THE INVENTION

1. Field of the Invention

The present invention is generally related to magnetic sensor elements and, more particularly, to a magnetic sensor element made by forming layers of tantalum nitride with a layer of nickel iron, or permalloy, disposed between the layers of tantalum nitride.

2. Description of the Prior Art

In many applications of magnetic sensors, magnetoresistive elements such as nickel iron are used to detect the component of a magnetic field that lies in the plane of the magnetoresistive material. In some applications, the magnetoresistive material is disposed in a serpentine array on a surface of a substrate such as silicon. The serpentine pattern of magnetoresistive material can be connected electrically in a Wheatstone bridge arrangement in order to sense changes in the resistance of the magnetoresistive material in response to changes in the strength of a magnetic field component in the plane of the magnetoresistive elements. In order to monitor the changes in the resistance of the material, associated components such as amplifiers are generally connected together to form an electrical circuit which provides an output signal that is representative of the strength of the magnetic field in the plane of the sensing elements. When the circuit is provided on a silicon substrate, electrical connections between associated components can be made above the surface of the silicon or by appropriately doped regions beneath the components and within the body of the silicon substrate. Components can be connected to each other above the surface of the silicon by disposing conductive material to form electrically conductive paths between the components. When components are connected in electrical communication with each other by appropriately doped regions within the silicon substrate, an electrically conductive path can be formed by diffusing a region of the silicon with an appropriate impurity, such as phosphorous, arsenic or Boron to form electrically conductive connections between the components.

In methods known to those skilled in the art, several problems exist with these types of connections. It is difficult to make both top and bottom electrical connections to an anisotropic magnetoresistive film, such as nickel iron. The selectivity of dry etches and the aggressive nature of wet etches make the process difficult to control.

U.S. Pat. No. 5,005,064, which issued to Yoshino et al on Apr. 2, 1991, discloses a device for detecting magnetism. The device comprises a substrate, an interposed insulating layer containing impurities therein formed on the substrate and a ferromagnetic magnetoresistive element formed on the interposed layer wherein at least a portion of the interposed layer on which the ferromagnetic magnetoresistive element is formed has a concentration of impurities of less than the predetermined value. Furthermore, the surface of the layer interposed between the substrate and the ferromagnetic magnetoresistive element has a surface roughness of less than 120 and an angle between a contacting surface of a conductive wiring and the ferromagnetic magnetoresistive element and the surface of the interposed layer is less than 78 degrees. Therefore, a device wherein a deterioration of the quality film of the ferromagnetic magnetoresistive element can be avoided and a reduction of the ratio of the resistance variation of the ferromagnetic magnetoresistive element can be maintained at less than 10% can be obtained. In addition, the device can effectively suppress the generation of noise so that it is highly sensitive to magnetism and has a high signal-to-noise ratio. Furthermore, the breakdown ratio caused by wiring breakages is effectively reduced.

It would be significantly beneficial if a magnetoresistive material could be disposed on a substrate in such a way that connection to the magnetoresistive material could easily be made from both above the magnetoresistive element and from below the magnetoresistive element. It would also be beneficial if the electrical contact did not degrade the magnetoresistive material. The protective sheath should be of significant bulk resistance to have a minimal effect on the sensitivity of the magnetoresistive material. The sheath should be of a very protective nature so as to allow patterning using photoresist and not degrade the magnetoresistive or the electrical properties. In other words, a significant benefit could be realized if interconnections to the magnetoresistive element could be made above the surface of the silicon substrate and above the upper surface of the sensing element and if electrical connection could also be made to the magnetoresistive element by conductive regions diffused into the body of the silicon substrate through a diffusion barrier.

SUMMARY OF THE INVENTION

A preferred embodiment of the present invention comprises a singly deposited three layer stack of materials which consist of an initial layer of approximately 300 angstroms of reactively sputtered tantalum in a nitrogen atmosphere. This process allows the stack to be contacted from its bottom side and helps to protect the silicon contact metallurgy from being disposed in direct contact with the nickel iron material. A layer of anisotropic magnetoresistive material, such as nickel iron (NiFe), can then be deposited on the tantalum nitride (TAN) without breaking a vacuum in the deposition chamber following the deposition of the initial tantalum nitride layer. After the nickel iron is deposited, an additional capping layer of tantalum nitride is deposited on the nickel iron, or permalloy material, to protect the nickel iron from post processing procedures and to allow low specific contact resistance to materials such as titanium tungsten and aluminum. The types of post processing methods that are used are ion milling interconnect metal deposition, interconnect metal pattering, and plasma enhance CVD nitride. Additionally, if the PECVD nitride has a pin hole, it will protect the sensing element from oxidation.

A particularly preferred embodiment of the present invention comprises a silicon substrate which, in turn, comprises a conductive diffusion, such as phosphorous, arsenic and/or Boron disposed in a surface of the silicon substrate and diffused into it. A first conductive contact material is disposed on the conductive diffusion. A first refractory nitride material is disposed on the first conductive contact material and a first magnetically sensitive conductive material is disposed on the first refractory nitride material. A second refractory nitride material is disposed on the first magnetically sensitive conductive material and an electromigration migration resistant material is disposed on the second refractory resistance material. A metallic layer is disposed on the electromigration migration resistant material.

In a preferred embodiment of the present invention, the first conductive contact material is a silicide, such as platinum silicide. The first refractory nitride material is tantalum nitride and the first magnetically sensitive conductive material is nickel iron. The second refractory nitride material is also tantalum nitride and the electromigration resistant material is titanium tungsten. The metallic layer can be aluminum.

A second magnetically sensitive conductive material can be disposed on the substrate and arranged in a serpentine pattern to be connected in electrical communication with the metallic layer.

BRIEF DESCRIPTION OF THE DRAWINGS

The present invention will be more fully and completely understood from a reading of the Description of the Preferred Embodiment in conjunction with the drawings, in which:

FIG. 4 is a partial view of FIG. 3.

DESCRIPTION OF THE PREFERRED EMBODIMENT

Figure 1:
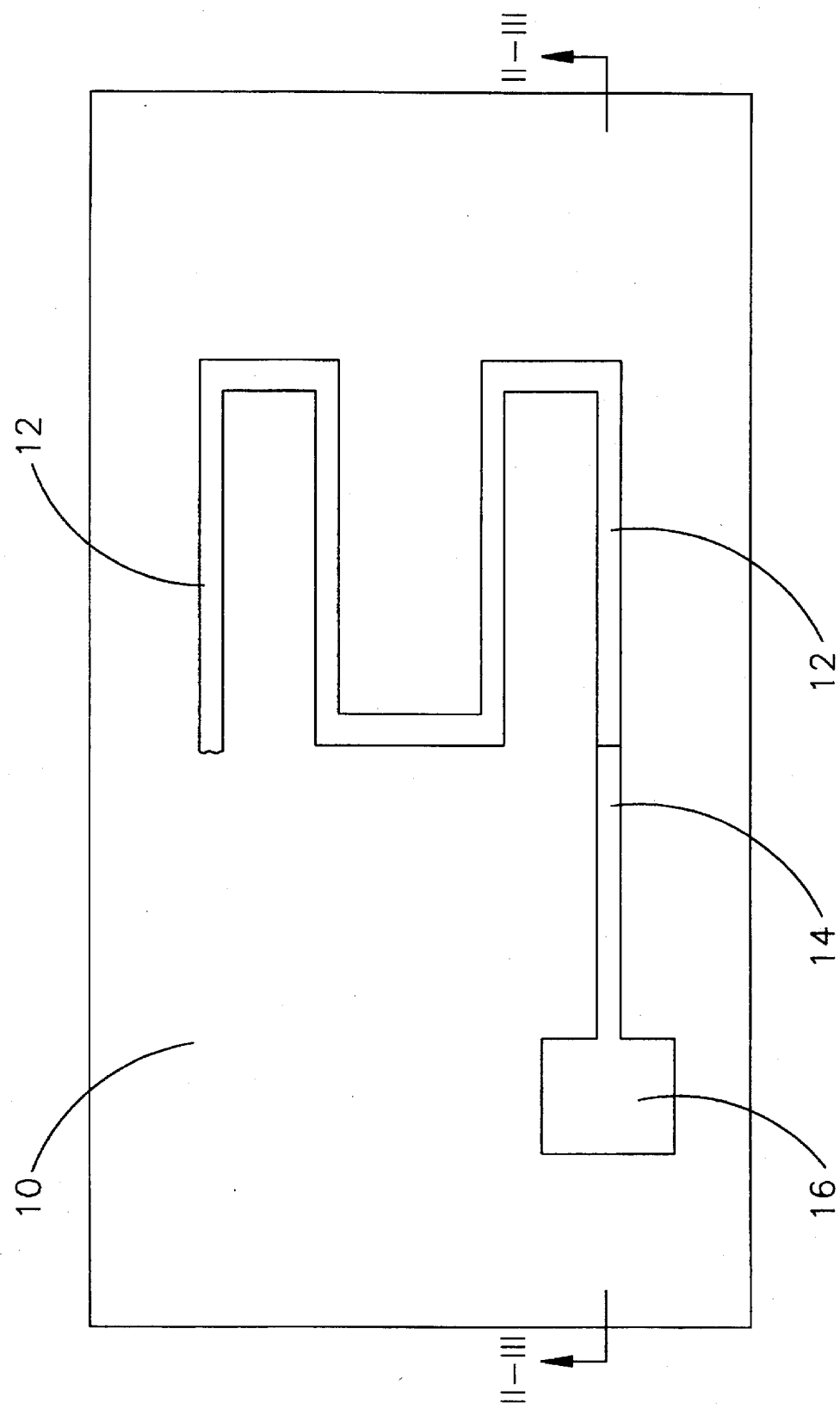
FIG. 1 is an exemplary top view of a magnetoresistive sensor.

Throughout the Description of the Preferred Embodiment of the present invention, like components will be identified by like reference numerals. FIG. 1 shows an exemplary top view of a portion of a circuit that comprises a magnetoresistive element. It should be understood that FIG. 1 is highly schematic in nature and intended to allow FIGS. 2 and 3 to show optional sectional views of the device for both a prior art configuration and a configuration made in accordance with the present invention.

Figure 2:
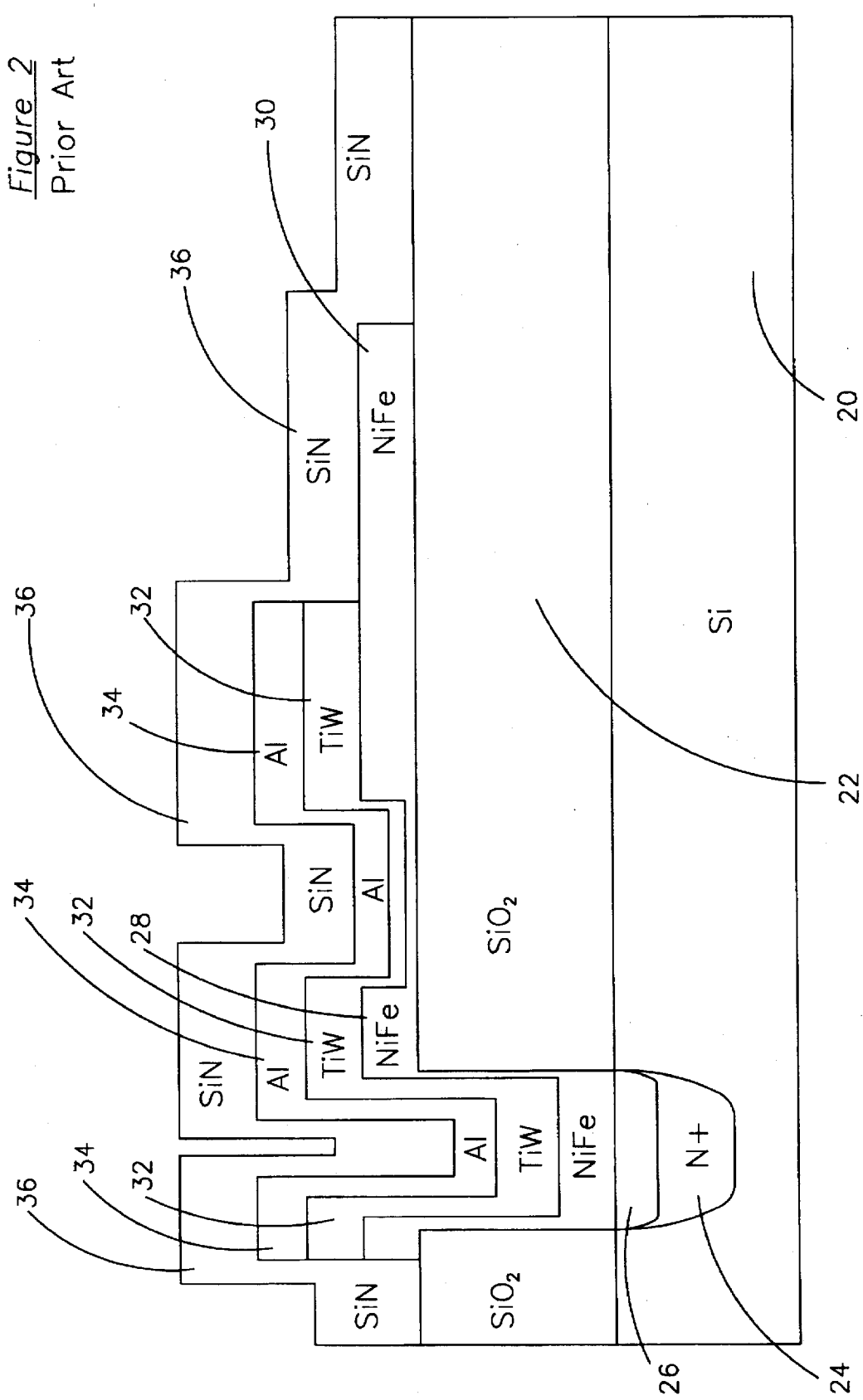
FIG. 2 is a sectional view of FIG. 1 made in accordance with principles known to those skilled in the art.
Figure 3:
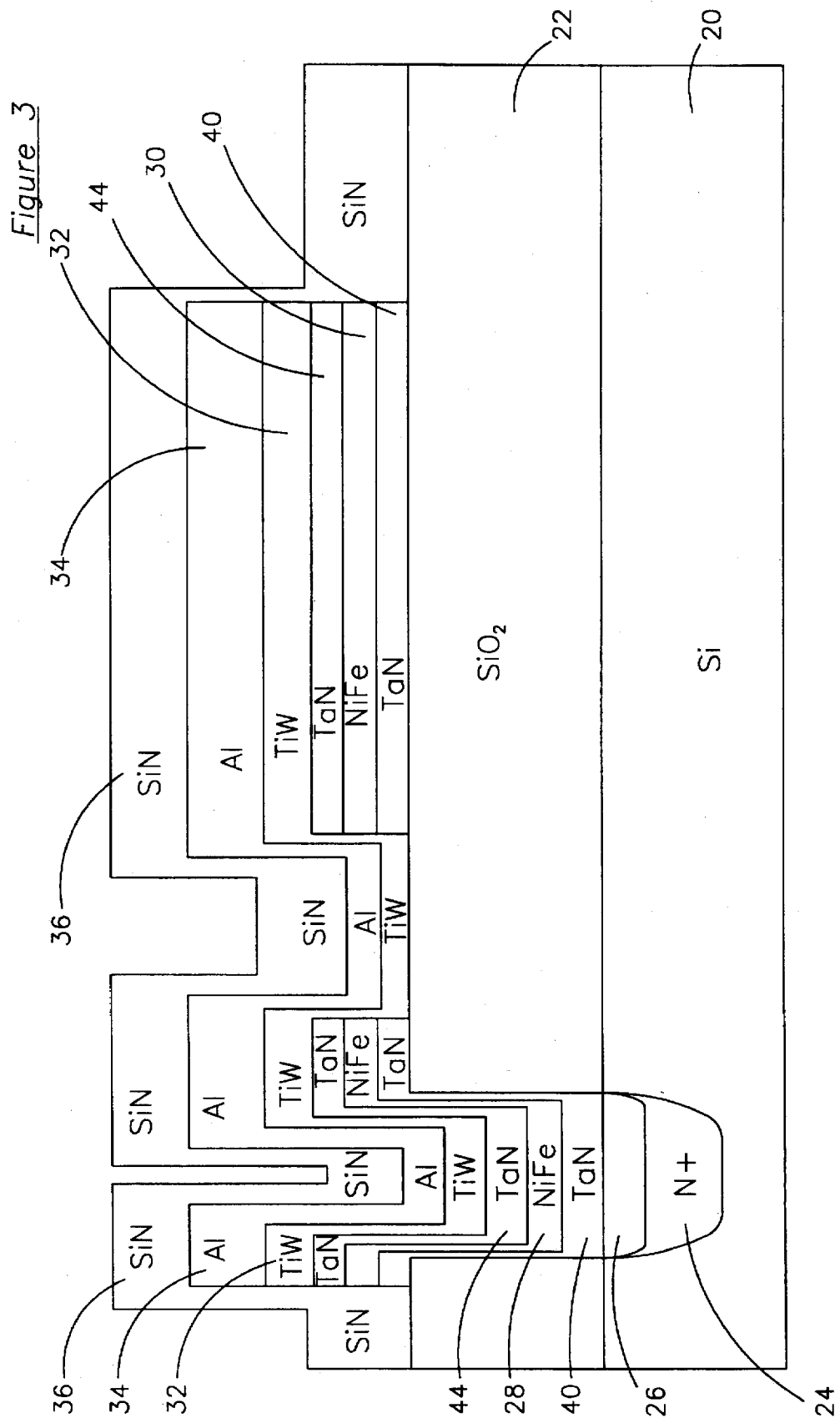
FIG. 3 is a sectional view of FIG. 1 made in accordance with the principles of the present invention.

In FIG. 1, a substrate 10 is provided and a serpentine pattern 12 of a magnetoresistive material is disposed on the upper surface of the silicon substrate 10. Reference numeral 14 represents an electrically conductive connector that is disposed in electrical communication with the serpentine pattern 12 of magnetoresistive material and reference numeral 16 represents a conductive pad to which electrical connection can be made from either an external component or other components on the silicon substrate 10. The section arrows in FIG. 1 are identified as II–III to indicate that FIGS. 2 and 3 are both sectional views of the device shown in FIG. 1. In the discussion below, FIG. 2 will describe how a sectional view of a prior art device would appear and FIG. 3 is intended to show how a device made in accordance with the present invention would appear.

FIG. 2 shows a sectional view of the device illustrated in FIG. 1 in accordance with principles that are generally known to those skilled in the art. A substrate 20 is made of silicon material and a coating of silicon dioxide 22 ($SiO_2$) is formed on the upper surface of the silicon 20. A conductive diffusion 24 is formed by doping a preselected region of the silicon with an appropriate impurity, such as phosphorous, and/or Boron, and then diffusing the impurity into the silicon. The diffusion 24 is used to provide a conductive path between associated components formed on the surface of the substrate. A silicide layer 26 is formed on the diffusion 24. A silicide 26, such as platinum silicide, has a low specific contact resistance. A layer of nickel iron 28 is disposed over the silicide 26 and in a pattern such as that identified by reference numeral 12 in FIG. 1. The nickel iron layer 28 disposed above the silicide 26 in FIG. 2 and the nickel iron 30 disposed on the silicon dioxide layer 22 can be discontinuous. A titanium tungsten, or TiW, layer 32 is disposed over the nickel iron layer 28 in the regions where a metallic layer 34 will eventually be disposed. In the illustration of FIG. 2, the metallic layer 34 is aluminum. The aluminum layer 34 is used to provide electrical connection between the diffusion 24 and the nickel iron layer 30. The titanium tungsten layer is used to protect the sides of the sensor from the aluminum etch.

The aluminum etch contains phosphoric acid and its effects are detrimental to the permalloy since the acid will etch iron. After the aluminum is etched, the aluminum is used as a self aligned mask for the removal of the TiW in the field which exposes the NiFe. The NiFe can then be patterned with photoresist and then wet etched.

With continued reference to FIG. 2, a protective layer of silicon nitride 36 is disposed over the other layers in order to provide protection from possible damage and contamination. The configuration shown in FIG. 2 has certain disadvantages. For example, the permalloy can be contaminated from direct exposure to photoresist, it can have large variations due to wet etching and it can be damaged by pinhole defects in the passivation.

FIG. 3 illustrates a sectional view of FIG. 1 in which the structure is manufactured according to the principles of the present invention. The silicon dioxide coating 22 on the silicon 20 is formed in a manner that is generally similar to that known in the prior art. In addition, the conductive diffusion 24 and the silicide layer 26 are formed within the body of the silicon. However, the nickel iron layer 28 is not disposed directly on the silicide layer 26. Instead, a layer of tantalum nitride 40 is disposed on the silicide layer 26 and, as shown in FIG. 3, at all of the regions where a nickel iron layer 28 will eventually be deposited. After the nickel iron layer 28 is deposited on the tantalum nitride layer 40, a second tantalum nitride layer 44 is deposited on the nickel iron layer 28. Following the completion of the formation of the tantalum nitride/nickel iron/tantalum nitride (TaN/NiFe/TaN) stack is formed, as represented by layers 40, 28 and 44, the titanium tungsten layer 32 is deposited over the stack in the regions where the metallic layer 34 will eventually be deposited. The titanium tungsten layer serves the same purposes that are described above in conjunction with the prior art. A protective layer of silicon nitride 36 or silicon dioxide is then deposited over the entire structure in order to protect all of the components during subsequent processing.

FIG. 4 illustrates an expanded view of the left portion of FIG. 3. The primary function of the tantalum nitride, or TaN, layers is that the tantalum nitride does not react with the nickel iron layer. In addition, it has a high sheet resistance which does not result in electrical shunts that could otherwise occur if alternative materials are used. In other words, the tantalum nitride material does not readily conduct electrical current in the direction of its plane. Because the tantalum nitride layer is very thin, this high sheet resistance does not disadvantageously affect the conduction of electrical current in a direction perpendicular to its plane. The platinum silicide 26 is used because it has a low specific contact resistance. The function of the nickel iron 28 is to protect the platinum silicide from the potentially disadvantageous effects of ion milling processes used during the manufacture of the sensor. Ion milling of NiFe produces a well defined sensor element with no undercutting of the photoresist. Complex sensor elements can be manufactured using this technique.

The titanium tungsten improves the contact to the tantalum nitride and protects the sides of the sensor from the aluminum layer. The aluminum etch can undercut the TaN and attack or remove sensor elements. After the aluminum is etched, the TiW is removed from the field using the aluminum as a mask.

In addition, the titanium tungsten layer significantly improves the ability of the aluminum to withstand electromigration. The titanium tungsten provides this advantageous characteristic by being an alternative electrical conductor in the regions where the aluminum may experience damage due to electromigration. Electromigration is caused by current density gradients. Electromigration results in mechanical damage of the conduction material which will eventually result in a loss of the conductive path.

The silicon nitride layer 36 is a passivation layer that protects the top surface of the various layers shown in the Figures from damage. Without silicon nitride, the aluminum or permalloy could be damaged.

In FIGS. 3 and 4, the various layers of the present invention have been illustrated for the purpose of showing their relative positions. However, it should be understood that no attempt has been made to draw these layers precisely to scale. In fact, actual micrographs of these sectional views could differ significantly from the illustrations which have distorted the dimensions of the layers for the purpose of permitting them to be more clearly identified and described. In a typical sensor made in accordance with the present invention, the silicon layer 20 would be approximately 15 mils thick. The silicon dioxide layer 22 would be approximately 1 micron thick. The thickness of the first tantalum nitride layer 40 would be approximately 0.0300 microns and the thickness of the second tantalum nitride layer 44 would be approximately 0.0900 microns. The nickel iron layer 28 disposed between the first and second tantalum nitride layers would have a thickness of approximately 0.0150 to 0.200 microns. The titanium tungsten layer 32 is approximately 0.12 microns thick and the aluminum layer 34 is approximately 0.9 microns thick. Over the entire structure, the silicon nitride layer 36 would be approximately 0.90 microns thick.

With reference to FIGS. 3 and 4, it can be seen that the stack of tantalum nitride and nickel iron layers significantly facilitates electrical connection from both the bottom portion of the Figures and the top portion while leaving the sensing element intact. In other words, the left portion of FIG. 3 shows how the present invention facilitates the electrical connection to a buried diffused layer 24 while preventing the NiFe from touching the diffused area while the right portion of FIG. 3 shows how the present invention facilitates electrical connection between the nickel iron layer 30 and the aluminum layer 34. In summary, the invention allows NiFe sensor elements to be manufactured to form complex geometries while allowing the sensor to be integrated into standard bipolar circuitry in the same integrated circuit. The invention allows the sensor to withstand temperatures in excess of 200° C.

The use of the tantalum nitride layers in combination with the nickel iron layer allows a sensor to be manufactured in a way that significantly reduces the processing steps. The tantalum nitride is a refractory material that is capable of withstanding high temperatures.

Although the present invention has been described with particular detail and specificity, alternative embodiments of the present invention are within its scope.

The embodiments of the invention in which an exclusive property or right is claimed are defined as follows:

1. Apparatus for providing electrical connection between components on a substrate, comprising:
   a silicon substrate;
   a conductive diffusion disposed in a surface of said silicon substrate;
   a first conductive contact material disposed on said conductive diffusion;
   a first refractory nitride material disposed on said first conductive contact material;
   a first magnetically sensitive conductive material disposed on said first refractory nitride material, said first magnetically sensitive conductive material being a NiFe alloy;
   a second refractory nitride material disposed on said first magnetically sensitive conductive material;
   an electromigration resistant material disposed on said second refractory resistant material; and
   a metallic layer disposed on said electromigration resistant material.

2. The apparatus of claim 1, wherein:
   said first conductive contact material is a silicide.

3. The apparatus of claim 2, wherein:
   said silicide is platinum silicide.

4. The apparatus of claim 1, wherein:
   said first refractory nitride material is tantalum nitride.

5. The apparatus of claim 1, wherein:
   said second refractory nitride material is tantalum nitride.

6. The apparatus of claim 1, wherein:
   said electromigration resistant material is TiW.

7. The apparatus of claim 1, wherein:
   said metallic layer is aluminum.

8. The apparatus of claim 1, further comprising:
   a second magnetically sensitive conductive material disposed on said substrate, said second magnetically sensitive conductive material being arranged in a serpentine pattern and connected in electrical communication with said metallic layer.

9. The apparatus of claim 8, wherein:
   said second magnetically sensitive conductive material is connected in electrical communication with said conductive diffusion.

10. Apparatus for providing electrical connection between components on a substrate, comprising:
    a silicon substrate;
    a conductive diffusion disposed in a surface of said silicon substrate;
    a first conductive contact material disposed on said conductive diffusion, said first conductive contact material being platinum silicide;
    a first refractory nitride material disposed on said first conductive contact material, said first refractory nitride material being tantalum nitride;
    a first magnetically sensitive conductive material disposed on said first refractory nitride material, said first magnetically sensitive conductive material being NiFe;
    a second refractory nitride material disposed on said first magnetically sensitive conductive material, said second refractory nitride material is tantalum nitride;
    an electromigration resistant material disposed on said second refractory resistant material, said electromigration resistant material being TiW; and
    a metallic layer disposed on said electromigration resistant material, said metallic layer being aluminum.

11. The apparatus of claim 10, further comprising:
    a second magnetically sensitive conductive material disposed on said substrate, said second magnetically sensitive conductive material being arranged in a serpentine pattern and connected in electrical communication with said metallic layer.

12. The apparatus of claim 11, wherein:

said second magnetically sensitive conductive material is connected in electrical communication with said conductive diffusion.

13. Apparatus for providing electrical connection between components on a substrate, comprising:

a silicon substrate;

a conductive diffusion disposed in a surface of said silicon substrate;

a first conductive contact material disposed on said conductive diffusion, said first conductive contact material being platinum silicide;

a first refractory nitride material disposed on said first conductive contact material, said first refractory nitride material being tantalum nitride;

a first magnetically sensitive conductive material disposed on said first refractory nitride material, said first magnetically sensitive conductive material being NiFe;

a second refractory nitride material disposed on said first magnetically sensitive conductive material, said second refractory nitride material is tantalum nitride;

an electromigration resistant material disposed on said second refractory resistant material, said electromigration resistant material being TiW;

a metallic layer disposed on said electromigration resistant material, said metallic layer being aluminum; and a second magnetically sensitive conductive material disposed on said substrate, said second magnetically sensitive conductive material being arranged in a serpentine pattern and connected in electrical communication with said metallic layer.

14. The apparatus of claim 13, wherein:

said second magnetically sensitive conductive material is connected in electrical communication with said conductive diffusion.

* * * * *